United States Patent [19]
Dow

[11] Patent Number: 5,469,106
[45] Date of Patent: Nov. 21, 1995

[54] VOLTAGE CONTROLLED AMPLIFIER WHICH REDUCES DIFFERENTIAL GAIN

[75] Inventor: Ronald N. Dow, San Jose, Calif.

[73] Assignee: Elantec, Inc., Milpitas, Calif.

[21] Appl. No.: 328,701

[22] Filed: Oct. 25, 1994

[51] Int. Cl.[6] .................................................. H03F 3/45
[52] U.S. Cl. ........................................ 330/254; 330/257
[58] Field of Search ................................. 330/252, 254, 330/257; 348/678, 707

[56] References Cited

U.S. PATENT DOCUMENTS 3,838,210  9/1974  Peil ........................................ 330/254 X
4,422,051  12/1983  Katakura et al. ..................... 330/254 X Primary Examiner—Steven Mottola
Attorney, Agent, or Firm—Fliesler, Dubb, Meyer & Lovejoy

[57] ABSTRACT

A voltage controlled amplifier which includes a gain core and a transconductive amplifier. The gain core includes two complimentary differential transistor pairs. The emitters of the four transistors of the two differential pairs are connected to complimentary diode connected transistors. The diode connected transistors balance the parasitic resistances of the dissimilar transistors, thereby, reducing differential gain and distortion.

22 Claims, 5 Drawing Sheets

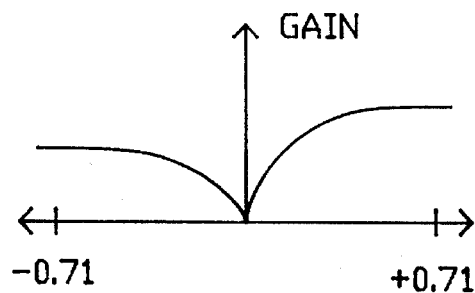
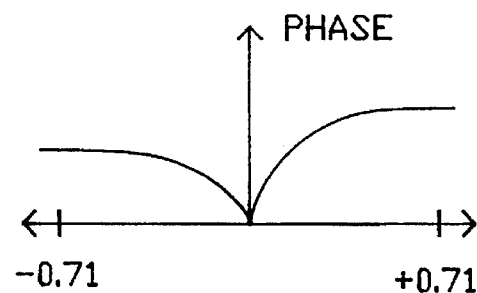
FIG.–2A   FIG.–2B
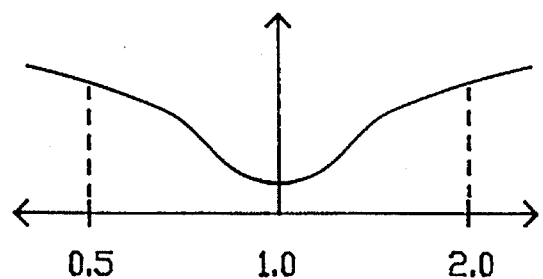
FIG.–2C
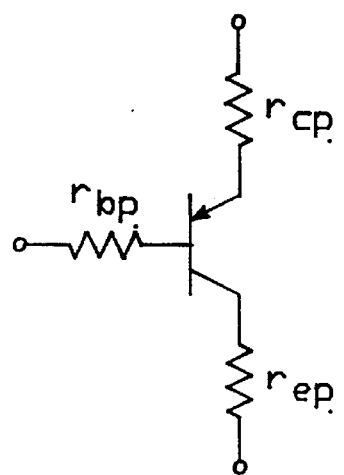
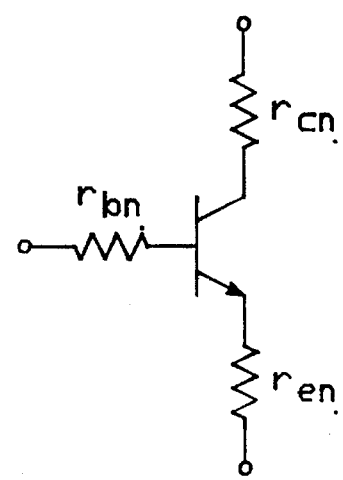
FIG.–3A   FIG.–3B

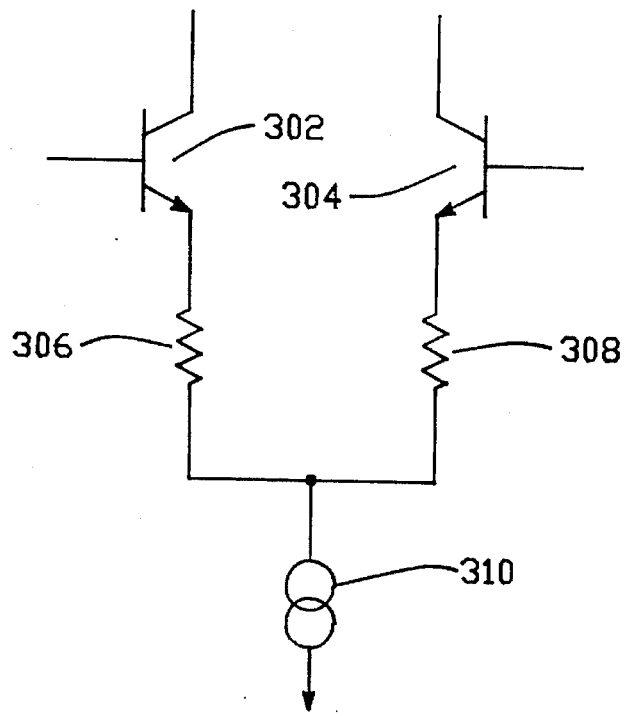
FIG.—6
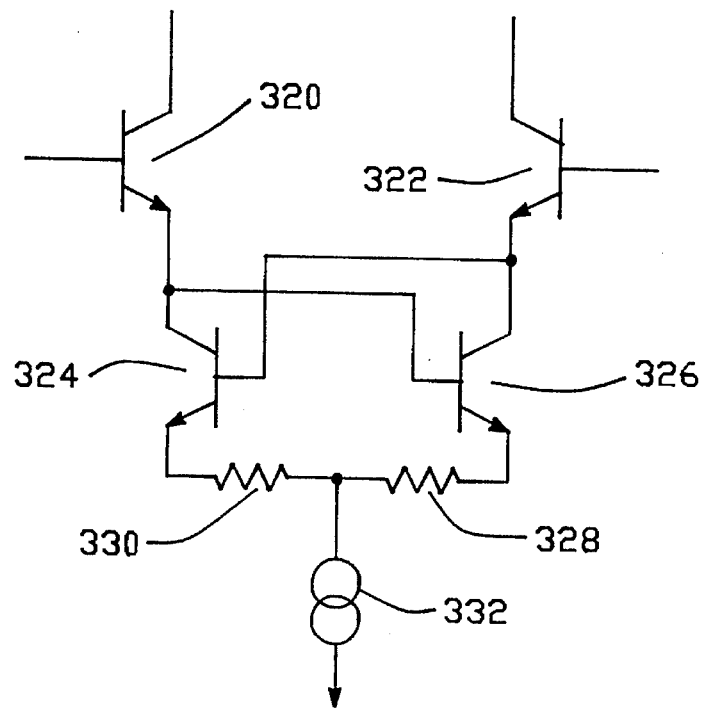
FIG.—7

VOLTAGE CONTROLLED AMPLIFIER WHICH REDUCES DIFFERENTIAL GAIN

BACKGROUND OF THE INVENTION

1. Field of the Invention

The present invention is directed to an improved voltage controlled amplifier and, more specifically, to a voltage controlled amplifier which minimizes differential gain and distortion.

2. Description of the Related Art

Amplification of electrical signals by a desired gain can be achieved using a voltage controlled amplifier (VCA), which uses a control voltage to determine the gain of the amplifier. FIG. 1 shows an example of a high performance current in/current out VCA 10 with a voltage gain control. The input port 38 receives an input signal from current source 12. The output, which is an amplification of input 12, is provided at port 14. For purposes of this patent, amplification is defined to include gain and/or attenuation and the definition of gain shall include both gain and attenuation. Additionally, the definition of "port" includes an input or output to the VCA circuit which may or may not be an internal node to a larger circuit. Control ports 16 and 18 are voltage inputs which are used to determine the amount of gain (or attenuation) for circuit 10. The gain core of circuit 10 consists of a differential pair of matched PNP transistors 20 and 22, and a differential pair of matched NPN transistors 24 and 26. Input port 38 is connected to the collectors of transistors 20 and 24. Output port 14 is connected to the collectors of transistors 22 and 26. The bases of transistors 20 and 26 are connected to voltage control 16 and, the bases of transistors 22 and 24 are connected to voltage control 18.

The signal input 12 is connected to the inverting input of amplifier 28 whose output drives the center tap 40 of resistor pair 30 and 32. The resistor pair modulates the tail currents of transistor pairs 20, 22 and 24, 26. The result of this action is that input port 38 is maintained at virtual ground as signal current is applied to input port 38. The voltages on control ports 16 and 18 determine the gain and, thus, the size of the signal that appears on output 14. Increasing the voltage on port 16 will cause the output signal to increase (gain will increase). Increasing the voltage on control port 18 will cause the output signal to decrease (gain will decrease or attenuation). The output current from port 14 can be used directly or converted to a voltage by connecting it to the virtual ground of a current/voltage converter. Current sources 34 and 36 are used to provide the DC bias.

The circuit of FIG. 1 has several important features and performance virtues. First, it has complimentary control inputs (e.g. 16 and 18). Second, if the control voltages are positioned near ground, the gain core transistors all have small collector to base voltages, which reduces the thermal effects that modulate the base to emitter voltages and cause distortion. Third, the circuit of FIG. 1 has virtual ground input and output structures that facilitate signal summing and aids in maintaining a wide bandwidth.

However, the prior art does have some shortcomings, especially when used in a video application. Amplifier 28 has to provide much larger voltage swings at node 40 than are found at the other nodes of the circuit. This necessitates that amplifier 28 have a fair amount of complexity to obtain the voltage gain and output voltage swings that are symmetrical about ground, which in turn limits the bandwidth of the circuit.

An even bigger problem involves distortion and gain differential. The circuit of FIG. 1 would work ideally if transistors 20, 22, 24 and 26 were identical in all respects. However, as can be seen, transistors 20 and 22 are PNP, while transistors 24 and 26 are NPN. For most complementary bipolar integrated circuit processes, the NPN and PNP transistors are dissimilar enough in terms of bulk emitter and series base resistance to cause poor distortion and differential gain/phase performance particularly over gain and attenuation. In order to better understand the present invention, this problem is described in greater detail with respect to video circuits.

When designing circuits for the video environment, the DC compliance range for the DC component of an NTSC signal is +/−0.710 volts. Thus, amplifier circuits with fixed gains are rated based on the change of gain of the amplifier circuit as it operates over the DC compliance range (−0.71 V to +0.710 V). FIG. 2A shows a typical plot of gain over the DC compliance range. As can be seen, the gain varies depending on the DC component of the video signal. In this example, highest gain is shown at 0.71 V, the positive edge of the DC compliance range, and lowest gain is at 0 volts DC. The difference between the highest gain and the lowest gain over the DC compliance range is known as the differential gain of the circuit. Differential gain is measured in percentages.

When a signal with an AC component is amplified, there tends to be a shift in phase between the output signal and the input signal. FIG. 2B shows a typical plot of phase changes over the DC compliance range. As can be seen, the greatest phase change occurs between the positive edge of the DC compliance range and 0 volts DC. The difference between the highest phase change and the lowest phase change is called the differential phase of the circuit. Differential phase is measured in degrees. The smaller the differential gain and differential phase, the higher the performance of the circuit.

FIGS. 2A and 2B show differential gain and phase, respectively, for an amplifier circuit which has a fixed gain. As discussed above, a VCA has a variable gain, controlled by the control voltage. For each gain value of a VCA there is a corresponding differential gain and differential phase. Thus, for each gain value of a VCA there is a separate set of graphs corresponding to FIGS. 2A and 2B. FIG. 2C shows a plot of differential gain on the vertical axis versus variable gain setting on the horizontal axis for the prior art VCA. As can be seen, at unity gain (gain equals 1.0) the differential gain is at a minimum, approximately 0.071%. As the gain is increased, differential gain increases significantly. Typical gains for video applications range from 100 to 1 or more. Even when the gain ranges from 0.5 to 2, the differential gain may become too large for high performance video applications. For example, for the circuit of FIG. 1: at gain=2, differential gain=0.46% and, at gain=0.5, differential gain=0.40%. A large differential gain can cause the VCA to operate with a deviation in the gain, resulting in a video picture that is not clear or as sharp as desired.

The differential gain is caused, in part, by the difference in the parasitics of the gain core transistors. FIG. 3A and 3B are symbolic representations of a PNP transistor and an NPN transistor, respectively, showing their parasitic resistances. FIG. 3A shows a PNP transistor with parasitic resistance $r_{cp}$ at its collector, a parasitic resistance $r_{ep}$ at its emitter and a parasitic resistance $r_{bp}$ at its base. FIG. 3B shows an NPN transistor with parasitic resistances $r_{cn}$ at its collector, a parasitic resistance $r_{en}$ at its emitter, and a parasitic resistance $r_{bn}$ at its base. An ideal transistor would not have parasitic resistances. However, realities of today's technology dictates that these parasitic resistances need to be taken into account in high performance situations. The problem arises mostly because the parasitic resistances at the emitters and bases of PNP transistors and NPN transistors ($r_{ep}$, $r_{bp}$ and $r_{en}$, $r_{bn}$) are dissimilar enough to cause high differential gain and distortion. For example, at unity gain the currents through all four transistors of the gain core in the circuit of FIG. 1 are similar and the voltage drops across the parasitic resistors are the same. Therefore, differential gain and distortion are at tolerable levels. But when the circuit of FIG. 1 deviates from unity gain, the current flowing through the transistors 20–24 varies and the differential gain and distortion levels increase to intolerable levels, causing undesirable degradation of the video picture over the allowed DC compliance range.

SUMMARY OF THE INVENTION

The present invention is directed to overcome the disadvantages of the prior art. Thus, one object of the present invention is to create an improved VCA which minimizes differential gain over the gain control range.

The present invention includes a voltage controlled amplifier circuit whose output signal is an amplification of the input signal. The gain of the circuit is determined by the voltages at the control ports. The gain core of the amplifier includes two complimentary differential pairs of transistors. Each of the transistors in the differential pairs is connected to a diode connected transistor of complementary type (matching transistor) in order to balance the effects of the dissimilar parasitic resistances within the gain core. The result is to significantly reduce distortion and differential gain when the VCA is operating with a gain or attenuation.

Additionally, the amplifier section of the prior art VCA is replaced by a transconductive element. The transconductive element, which forces the input side of the gain core to absorb the input current, allows for lower voltage swings and higher bandwidth performance. In various alternatives, the transconductive element could be complementary differential amplifiers, simple degenerated complimentary differential stages, complimentary Caprio circuits, complimentary dual offset differentiated pairs of transistors or any other equivalent circuit.

Accordingly, one aspect of the present invention includes a voltage controlled amplifier which includes at least one gain control port, adapted to receive at least one gain control signal; an input port, adapted to receive an input signal; and an output port, adapted to present an output signal. The VCA also includes two differential pairs of transistors connected to the gain control port, the input port and the output port. A plurality of matching transistors is included, each of the plurality of matching transistors are connected and complimentary to one transistor of the first and second differential pairs. The VCA also includes an amplifier connected to the signal input and the first differential pair.

These and other objects and advantages of the invention will appear more clearly from the following description in which the preferred embodiments of the invention have been set forth in detail in conjunction with the drawings.

BRIEF DESCRIPTION OF THE DRAWINGS

FIG. 2A is a plot of gain versus the DC component of a video signal, over the DC compliance range for NTSC signals.

FIG. 2B is a plot of phase versus the DC component of a video signal, over the DC compliance range for NTSC signals.

FIG. 2C is a plot of differential gain versus variable gain for a voltage controlled amplifier.

FIGS. 3A and 3B are symbolic representations of PNP and NPN transistors, respectively, showing parasitically resistances.

FIG. 6 depicts a third alternative amplifier section.

FIG. 7 depicts a fourth alternative amplifier section.

DESCRIPTION OF THE PREFERRED EMBODIMENTS

Figure 4:
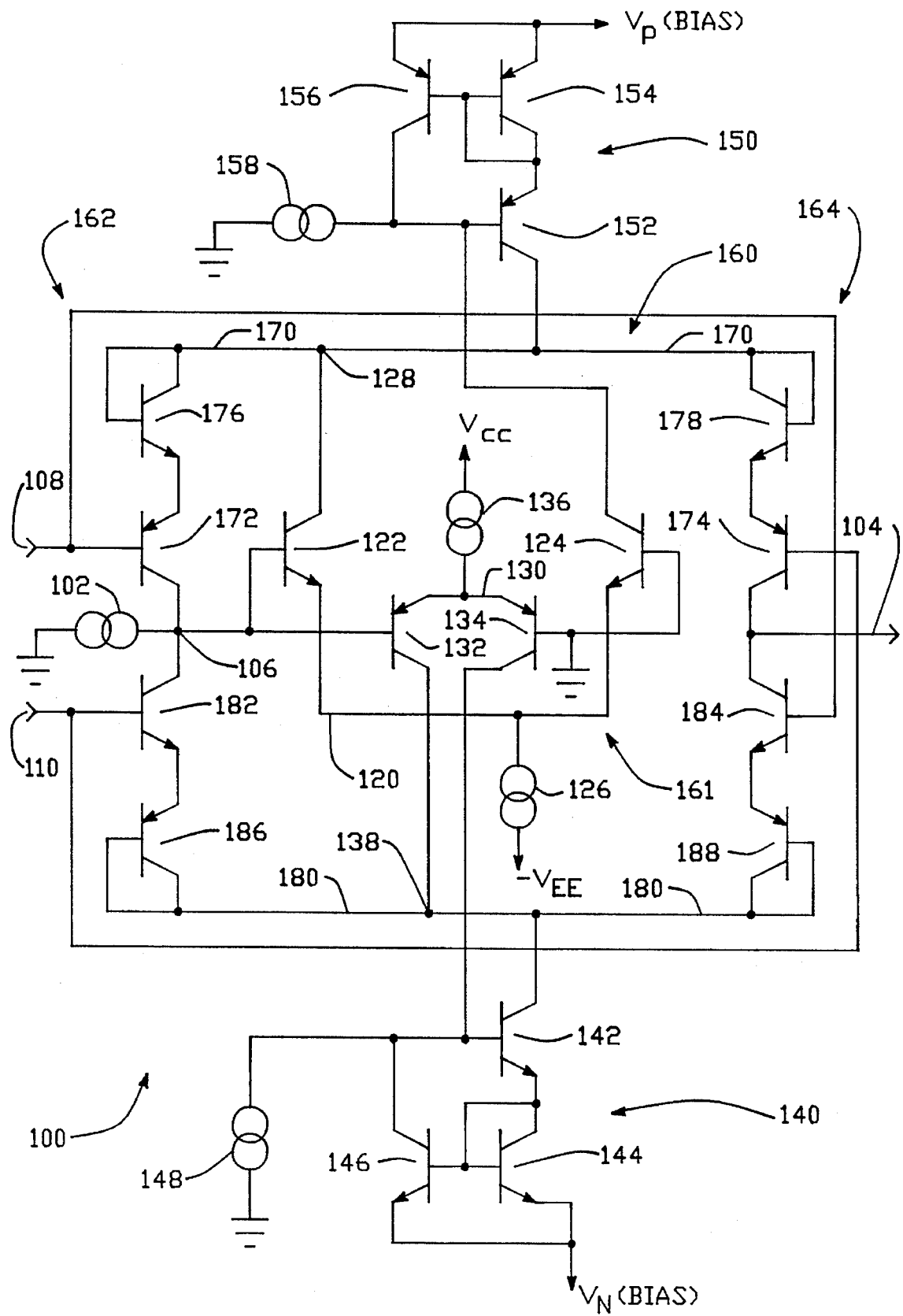
FIG. 4 is a voltage controlled amplifier, in accord with the present invention, depicting the preferred embodiment gain core with a first alternative amplifier section.

FIG. 4 is a schematic representation of a voltage controlled amplifier circuit 100 in accord with the present invention. Circuit 100 includes an output port 104 and, an input port 106 which receives an input signal represented by current source 102. Although the preferred embodiment is a current in/current out VCA, the output and/or input could be voltages. For example, the input would be a voltage if a resistor is connected between the input port and the input voltage source, and the output would be a voltage if a current/voltage converter is added to the output. The signal at output port 104 is an amplification of the signal from input port 106. The gain of the circuit is controlled by the differential voltage between control ports 108 and 110. As the voltage is increased at control port 108, the gain increases. As the voltage is increased at control port 110, the gain decreases. Thus, if the voltage at ports 108 and 110 are equal the circuit will operate at unity gain. Subsequently, if the voltage at control port 110 is increased, the circuit will begin to attenuate the signal. Alternatively, if the circuit is at unity gain and the voltage is increased at control port 108, the gain of the circuit will increase.

An alternative embodiment may include one control port. For example, if control port 110 is grounded, the gain can be controlled by varying the voltage on control port 108.

Circuit 100 includes a gain core 160 and an amplifier stage 161. Gain core 160 includes two complimentary differential transistor pairs 170 and 180. The gain core can also be logically separated into an input stage 162 and an output stage 164.

Differential pair 170 includes transistors 172, 174, 176 and 178. PNP transistors 172 and 174 serve as the traditional differential transistors. Diode connected NPN transistor 176 is connected to the emitter of transistor 172 and diode connected NPN transistor 178 is connected to the emitter of transistor 174. The collectors and bases of diode connected transistors 176 and 178 are connected together and to current mirror 150 via the collector of transistor 152. Current mirror 150 keeps the currents through the emitters of transistors 172 and 174 at a fixed sum. Control node 108 is connected to the base of transistor 172 and, control node 110 is connected to the base of transistor 174. The output of differential pair 170 is the collector current from transistor 174, which is added to the output of the differential pair 180. The sum of the two differential pair output currents comprise the output current which is presented at output node 104.

Differential pair 180 includes transistors 182, 184, 186 and 188. NPN transistors 182 and 184 serve as the traditional differential transistors. Connected to the emitter of transistor 182 is diode connected PNP transistor 186. Connected to the emitter of transistor 184 is diode connected PNP transistor 188. Both diode connected transistors 186, 188 are subsequently connected to each other and to current mirror 140 via the collector of transistor 142. Current mirror 140 keeps the currents through the emitters of transistors 182 and 184 at a fixed sum. Control node 108 is connected to the base of transistor 184 and, control node 110 is connected to the base of transistor 182. The output of differential pair 180 is taken from the collector of transistor 184.

Figure 1:
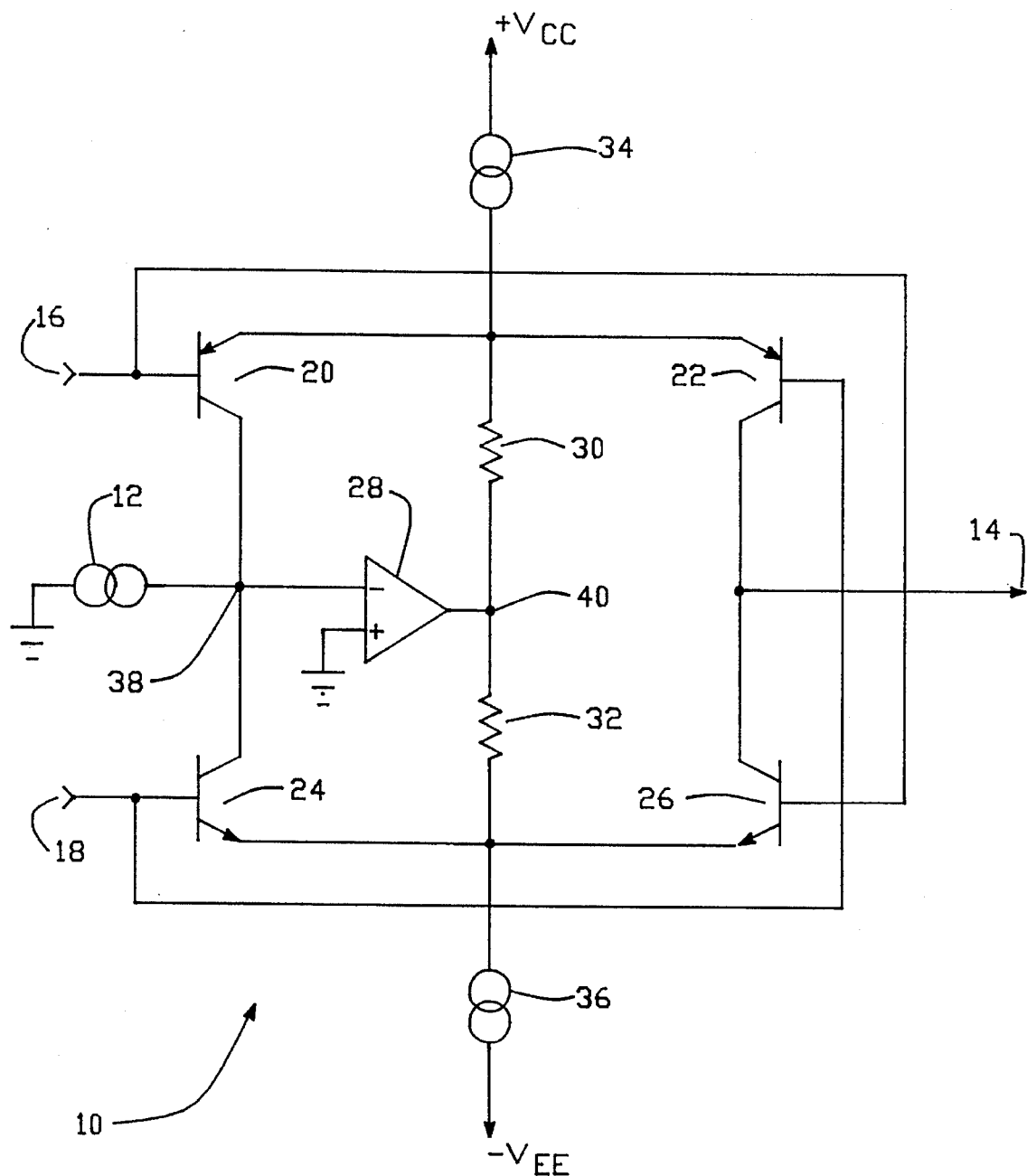
FIG. 1 is a schematic representation of a prior art voltage controlled amplifier.

The purpose of diode connected transistors 176, 178 and 186, 188 (matching transistors) is to match the parasitic resistances of PNP transistors 172 and 174 with NPN transistors 182 and 184. Thus, each of the four differential transistors—172, 174, 182 and 184—are connected to diode connected complementary transistors in such a way as to form composite devices with similar or identical parasitic resistances. Since each composite device includes both PNP and NPN transistors, the parasitic resistances of each composite device is similar or identical; therefore, reducing differential gain. (Similar parasitic resistances means identical for practical purposes but not necessarily exactly identical.) For example, for the circuit of FIG. 1: at gain=0.5, differential gain=0.396%; at gain=1, differential gain=0.071%; and at gain=2, differential gain=0.46%. In the circuit of FIG. 4: at gain=0.5, differential gain=0.05%; at gain=1, differential gain=0.036%; and at gain=2, differential gain=0.023%.

Amplifier stage 161 comprises a first differential amplifier 120, a second differential amplifier 130, a first current mirror 140 and a second current mirror 150. Differential amplifier 120 is an NPN differential amplifier, while differential amplifier 130 is a PNP differential amplifier. Differential amplifiers, which are well known in the art, are effective to generate an output signal in response to a difference between the inputs of the amplifier. Differential amplifiers may also be driven with a single ended signal at one input if the other input is grounded, as in differential amplifiers 120 and 130. The outputs of differential amplifiers 120 and 130 are connected to the tail nodes 128 and 138 of the gain core and to the inputs of current mirrors 150 and 140.

The first differential amplifier 120 includes NPN transistors 122 and 124, both of which have their emitters connected to current source 126. The base of transistor 122 is connected to input node 106 and the collector of transistor 122 is connected to the gain core at tail node 128. The base of transistor 124 is connected to ground and, the collector of transistor 124 is connected to the input of current mirror 150 at the base of transistor 152. Current source 126 sinks current from the common emitters of transistors 122 and 124, holding the total emitter current fixed. The distribution of this emitter current between the collectors of transistors 122 and 124 is determined by the signal applied to node 106. Thus, a signal at node 106 produces differentially related currents at the collectors of transistors 122 and 124.

The second differential amplifier 130 includes transistors 132 and 134, and corresponds to the basic differential amplifier circuit 120 with PNP transistors replacing the NPN transistors. Specifically, the base of transistor 132 is connected to input node 106 and the base of transistor 134 is grounded. Current source 136 sources current to the common emitters of transistors 132 and 134, holding the total emitter current fixed. The distribution of this emitter current between the collectors for transistors 132 and 134 is determined by the signal applied to the input node 106.

The circuit of FIG. 4 includes two current mirrors 140 and 150, which are used to supply currents to the gain core. The current mirrors are optional and can be replaced by other current sources. Current mirror 140 includes transistors 142, 144 and 146. The base of transistor 146, the base of transistor 144, the collector of transistor 144 and the emitter of transistor 142 are connected together. The emitters of transistors 144 and 146 are connected to $V_N$. The base of transistor 142 and the collector of transistor 146 are connected to source 148. Thus, current mirror 140 supplies a current which is programmed by a current. The base of transistor 142 is also connected to the collector of transistor 134 of differential amplifier 130. The collector of transistor 142 is connected to the gain core at the collectors and bases of transistors 188 and 186.

Current mirror 150 includes transistors 152, 154 and 156. The base of transistor 156, the base of transistor 154 and collector of transistor 154 are connected to the emitter of transistor 152. The base of transistor 152 and the collector of transistor 156 are connected to source 158 and to the collector of transistor 124 of differential amplifier 120. The collector of transistor 152 is connected to the gain core at node 128.

Circuit 100 operates in the following manner. If voltage control ports 108 and 110 are both grounded, a similar current flows through the transistors of the gain core, differential pairs 170 and 180 operate like differential amplifiers and circuit 100 operates at unity gain. If circuit 100 is not at unity gain, differential pairs 170 and 180 act like offset differential amplifiers.

If control port 110 is grounded and control port 108 is raised to some non-zero value (e.g. 18 millivolts), the bias across transistor 184 is increased and the bias across transistor 172 is decreased (due to their complimentary nature). Similarly, the bias across transistor 174 will increase as compared to the bias across transistor 182. Alternatively, if control port 110 is raised to a potential greater than that of control port 108, the bias across transistor 184 is decreased and the bias across transistor 172 is increased. Similarly, the bias across transistor 174 will decrease as the bias across transistor 182 increases. Circuit 100 is arranged in such a way that the transistors at input stage 162 of the gain core are de-biased and the transistors at output stage 164 are biased by a greater potential on port 108 as compared to port 110. The transistors at input stage 162 are biased and the transistors at output stage 164 are de-biased by a greater potential on port 110 as compared to port 108. Thus, gain conditions are being changed between input side 162 and output side 164 of circuit 100 by imposing a differential voltage between nodes 108 and 110.

Amplifier stage 161 forces transistors 172 and 182 to absorb the input current from input node 106. If, for example, transistors 172 and 182 are running de-biased with respect to transistors 174 and 184, transistors 172 and 182 are by the action of amplifier stage 161 forced to accept the input signal by appropriately scaling their collector currents. The input signal is then translated to the output side. Assuming perfect matching between like devices and a log relationship between the base-emitter voltages and the collector currents, transistors 172 and 174 will operate under the same boundary conditions and amplifier stage 161 sets up those conditions by the action of feedback. The operating conditions of transistors 172 and 182 are reflected from input stage 162 to output stage 164. If transistors 172 and 174 are matched and transistors 182 and 184 are matched, then the circuit will achieve a reflection of the signal between the input and the output with a multiplication operation between the input stage 162 and the output stage 164. In other words, once transistors 172 and 182 absorb the input signal and operate at a given bias voltage, a higher bias voltage is enforced by hard connection over to transistors 174 and 184 which operate at a higher gain than transistors 172 and 182. And, if transistors 172 and 174 are matched and, transistors 182 and 184 are matched, gain can be controlled.

As a side effect, amplifier 161 holds input node 106 to a virtual ground. Virtual ground is defined as the low impedance inverting input of an amplifier with negative feedback. The advantage of holding the input node 106 to virtual ground, is that transistors 172 and 182 will not saturate. The proper operating conditions of transistors 172 and 182 are ensured and, to the extent that the gain of the amplifier is low and its transfer characteristics are nonlinear, distortion is reduced.

Amplifier stage 161 has two outputs (128 and 138) which are mirror images of each other. If the current at one of the outputs increases, the current at the other output will decrease. Outputs 128 and 138 are connected to the top and the bottom of the gain core. The output of amplifier stage 161 is current, which is necessary because the transistors of the gain core are current devices. The prior art circuit of FIG. 1 includes resistors between op-amp 28 and the gain core in order for the amplifier stage to output differential currents.

Amplifier stage 161 of the circuit depicted in FIG. 4 is a transconductor. A transconductor has a voltage input(s) and current output(s). The advantage of using a transconductor amplifier is that gain is not relatively high and the transfer characteristic can be relatively linear. The gain is made high enough so that the amplifier will absorb the input current from source 102 that is fed into the input side of the amplifier. The current sources 136, 126, 148 and 158 will determine the maximum current that can be fed into the input before the amplifier gives up and transistors 172 and 182 saturate. Amplifier stage 161 can be replaced by various other transconductors which can be used to impose the operating conditions onto the gain core. For example, FIG. 5 is a schematic drawing of the gain core of FIG. 4 and an alternative (and preferred) amplifier stage.

Figure 5:
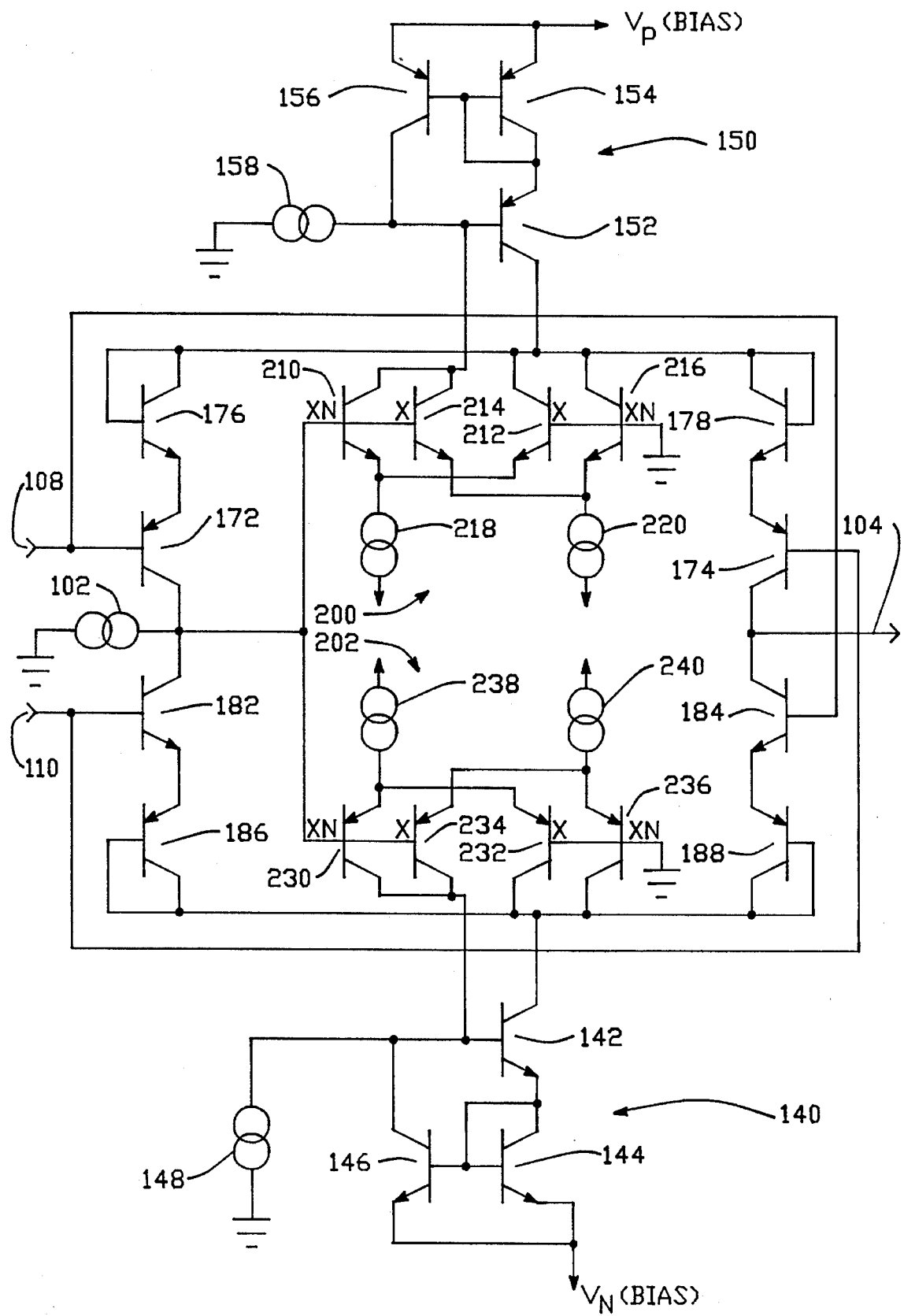
FIG. 5 depicts the preferred embodiment gain core with a second alternative amplifier section.

The circuit of FIG. 5 behaves similar to circuit 100 of FIG. 4. Because the gain core of FIG. 5 is the same gain core of FIG. 4, the identical reference numbers are used. The alternative amplifier includes complimentary dual offset differential pairs 200 and 202. Two differential transistor pairs 210, 212 and 214, 216 are connected back-to-back. The emitters of transistors 210 and 212 are connected to source 218. The emitters of transistors 214 and 216 are connected to the source 220. The collectors of transistors 210 and 214 are connected to current mirror 150 at the base of transistor 152. The collectors of transistors 212 and 216 are connected to the gain core at the base and collectors of diode connected transistors 176 and 178.

Differential transistor pairs 230, 232 and 234, 236 are also connected back-to-back. The emitters of transistors 230 and 232 are connected to source 238. The emitters of transistors 234 and 236 are connected to source 240. The collectors of transistors 230 and 234 are connected to current mirror 140 at the base of transistor 142. The collectors of transistors 232 and 236 are connected to the gain core at the base and collectors of diode connected transistors 186 and 188.

"X" is a parameter corresponding to the emitter area of the transistors. Thus, the emitter areas of transistors 210 and 216 are N times greater than the emitter areas of transistors 212 and 214. Similarly, the emitter areas of transistors 230 and 236 are N times greater than the emitter areas of transistors 234 and 232. In the preferred embodiment of the present invention, N is between 3 and 7. The greater the value of N, the greater the saturation current. With greater saturation current, a transistor can operate at higher emitter currents.

FIG. 6 shows another alternative transconductor amplifier, a simple degenerated differential stage, which exhibits better linearity at the expense of gain. The circuit includes two transistors 302 and 304. Resistor 306 is connected to the emitter of transistor 302 and, resistor 308 is connected to the emitter of transistor 304. Resistors 306 and 308 are connected to the current source 310 which sinks the emitter currents and maintains a fixed total emitter current. The gain of the amplifier is set by resistors 306 and 308.

FIG. 7 shows another alternative amplifier: a Caprio differential stage circuit which provides lower signal distortion but lower frequency response than the basic amplifier circuit of FIG. 4. This circuit includes four transistors 320, 322, 324 and 326. The emitter of transistor 320 is connected to the collector of transistor 324 and the base of transistor 326. The emitter of transistor 322 is connected to the base of transistor 324 and the collector of transistor 326. The emitter of transistor 324 is connected to resistor 330. The emitter of transistor 326 is connected to resistor 328. Resistors 328 and 330 are connected to source 332, which holds the sum of the emitter currents of transistors 324 and 326 at a fixed value. Gain is determined by resistors 328 and 330.

The circuits of FIGS. 6 and 7 show only the NPN stage. These circuits are used with the preferred gain core as a part of a complimentary pair. For example, FIG. 5 shows NPN stage 200 and PNP stage 202. Thus, the circuits of FIGS. 6 and 7 would be used with corresponding PNP equivalents.

The foregoing detailed description of the invention has been presented for purposes of illustration and description. It is not intended to be exhaustive or to limit the invention to the precise form disclosed, and obviously many modifications and variations are possible in light of the above teaching. The discussed voltage controlled amplifiers were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A voltage controlled amplifier adapted to receive at least a first gain control signal and an input signal, said voltage controlled amplifier further adapted to present an output signal which is an amplification of said input signal, said amplification based on said gain control signal, comprising:

a first gain control port, adapted to receive said first gain control signal;

an input port, adapted to receive said input signal;

an output port, adapted to present said output signal;

a first differential pair of transistors, connected to said gain control port, said input port and said output port;

a second differential pair of transistors, connected to said gain control port, said input port, said output port and said first differential pair of transistors, said second differential pair being of an opposite conductivity type than said first differential pair;

a plurality of matching transistors, each of said plurality of matching transistors connected to and complimentary to one transistor of said first and second differential pairs; and an amplifier connected to said input port and said first differential pair.

2. A voltage controlled amplifier according to claim 1, wherein:

said gain control port includes a first port adapted to receive a first gain control signal and a second port adapted to receive a second gain control signal; and said amplification being based on a differential between said first gain control signal and said second gain control signal.

3. A voltage controlled amplifier according to claim 1, wherein:

said amplifier is adapted to force said first and second differential pairs to absorb said input signal.

4. A voltage controlled amplifier according to claim 1, wherein:

said first differential pair includes first and second transistors;

said second differential pair includes third and fourth transistors;

said plurality of matching transistors includes fifth sixth, seventh and eight transistors;

said first and fifth transistors form a first composite device having first parasitic resistances;

said second and sixth transistors form a second composite device having second parasitic resistances;

said third and seventh transistors form a third composite device having third parasitic resistances;

said fourth and eighth transistors form a fourth composite device having fourth parasitic resistances; and said first, second, third and fourth parasitic resistances are similar.

5. A voltage controlled amplifier according to claim 4, wherein:

said fifth, sixth, seventh and eighth transistors are diode connected;

said first gain control port includes a first port adapted to receive a first gain control signal and a second port adapted to receive a second gain control signal;

said amplification being based on a differential between said first gain control signal and said second gain control signal; and said amplifier is transconductive.

6. A voltage controlled amplifier according to claim 1, wherein:

said amplifier holds said input port at virtual ground.

7. A voltage controlled amplifier according to claim 1, wherein:

said amplifier includes a current mirror adapted to supply current to said gain core.

8. A voltage controlled amplifier according to claim 1, wherein:

said amplifier is transconductive.

9. A voltage controlled amplifier according to claim 8, wherein:

said amplifier includes a complimentary differential amplifier.

10. A voltage controlled amplifier according to claim 8, wherein:

said amplifier includes a simple degenerated differential stage.

11. A voltage controlled amplifier according to claim 8, wherein:

said amplifier includes a Caprio circuit.

12. A voltage controlled amplifier according to claim 8, wherein:

said amplifier includes a dual offset differential pair of transistors.

13. A voltage controlled amplifier adapted to receive at least a first gain control signal and an input signal, said voltage controlled amplifier further adapted to present an output signal which is an amplification of said input signal, said amplification based on a differential of said two gain control signals, comprising:

a first gain control port, adapted to receive said first gain control signal;

an input port, adapted to receive an input signal;

an output port, adapted to present an output signal;

a gain core, connected to said gain control ports, said input port and said output port, said gain core including:

a first differential pair of transistors including a first transistor and a second transistor, a second differential pair of transistors including a third transistor and a fourth transistor, a fifth transistor connected to said first transistor and complimentary to said first transistor;

a sixth transistor connected to said second transistor and complimentary to said second transistor;

a seventh transistor connected to said third transistor and complimentary to said third transistor; and a eighth transistor connected to said fourth transistor and complimentary to said fourth transistor; and an amplifier, connected to said signal input and said gain core.

14. A voltage controlled amplifier according to claim 13, further including:

a second gain control port adapted to receive a second gain control signal, said amplification is based on said differential between said first gain control signal and said second gain control signal.

15. A voltage controlled amplifier according to claim 13, wherein:

said first differential pair is complimentary to said second differential pair.

16. A voltage controlled amplifier according to claim 13, wherein:

said first and fifth transistors form a first composite device having first parasitic resistances;

said second and sixth transistors form a second composite device having second parasitic resistances;

said third and seventh transistors form a third composite device having third parasitic resistances;

said fourth and eighth transistors form a fourth composite device having fourth parasitic resistances; and said first, second, third and fourth parasitic resistances are similar.

17. A voltage controlled amplifier according to claim 13, wherein:

said fifth, sixth, seventh and eighth transistors are diode connected.

18. A voltage controlled amplifier according to claim 13, wherein:

said amplifier is a transconductor.

19. A voltage controlled amplifier adapted to receive at least a first gain control signal and an input signal, said voltage controlled amplifier further adapted to present an output signal which is an amplification of said input signal, said amplification based on said first gain control signal, comprising:

a gain control port, adapted to receive said first gain control signal;

an input port, adapted to receive said input signal;

an output port, adapted to present said output signal;

a first differential pair of transistors, connected to said gain control port, said input port and said output port, said first differential pair including a first composite device and a second composite device;

a second differential pair of transistors, connected to said gain control port, said input port, said output port and said first differential pair of transistors, said second differential pair being of an opposite conductivity type than said first differential pair, said second differential pair including a third composite device and a fourth composite device;

means for matching the parasitic resistances of said first, second, third and fourth composite devices; and an amplifier, connected to said signal input and said first differential pair.

20. A voltage controlled amplifier according to claim 19, further including:

a second gain control port adapted to receive a second gain control signal, said amplification being based on a differential between said first gain control signal and said second gain control signal.

21. A voltage controlled amplifier according to claim 19, wherein:

said first differential pair is complimentary to said second differential pair.

22. A voltage controlled amplifier according to claim 19, wherein:

said amplifier is a transconductor.

\* \* \* \* \*

UNITED STATES PATENT AND TRADEMARK OFFICE
CERTIFICATE OF CORRECTION

PATENT NO. : 5,469,106
DATED : November 21, 1995
INVENTOR(S) : Ronald N. Dow

It is certified that error appears in the above-indentified patent and that said Letters Patent is hereby corrected as shown below:

Col. 2, line 58, delete "FIG" and substitute therefor --FIGS--

<u>In the Claims</u>

Col. 9, line 25, delete "fifth" and substitute therefor --fifth,--

Col. 9, line 35, after "and", start a new paragraph

Signed and Sealed this

Twenty-eighth Day of May, 1996

Attest:

BRUCE LEHMAN

*Attesting Officer*    *Commissioner of Patents and Trademarks*